United States Patent [19]

Petrie et al.

[11] Patent Number: 5,001,364

[45] Date of Patent: Mar. 19, 1991

[54] THRESHOLD CROSSING DETECTOR

[75] Inventors: Adelore F. Petrie, Arlington Heights; Roy E. Hunninghaus, Des Plaines, both of Ill.

[73] Assignee: Motorola, Inc., Schaumburg, Ill.

[21] Appl. No.: 448,440

[22] Filed: Dec. 11, 1989

[51] Int. Cl.$^5$ .......................................... H03K 5/153
[52] U.S. Cl. ..................... 307/354; 307/362; 307/480; 307/518; 307/527; 307/542.1; 348/661
[58] Field of Search ............... 307/354, 362, 480, 518, 307/527, 542.1; 340/661

[56] References Cited

U.S. PATENT DOCUMENTS

| | | | |
|---|---|---|---|
| 4,169,232 | 9/1979 | Henrich | 307/354 |
| 4,352,999 | 10/1982 | Galpin | 307/354 |
| 4,665,820 | 5/1987 | Chapman | 307/354 X |

Primary Examiner—Stanley D. Miller
Assistant Examiner—Scott A. Ouellette
Attorney, Agent, or Firm—John H. Moore

[57] ABSTRACT

A method and apparatus is disclosed for forming a binary level output signal which has a single transition representative of a threshold crossing in a sensor output signal. The sensor output signal is applied to the inputs of two signal processing circuits, the first of which develops a first signal having a relatively fast transition representing the threshold crossing. The second circuit develops a second output signal that is representative of an integrated version of the sensor signal. In the preferred embodiment, a flip-flop receives the first signal at a clock input and the second signal at a data input. The flip-flop's set input may also receive the second signal. The resultant output signal from the flip-flop has but a single transition representing the threshold crossing, irrespective of noise-induced threshold crossings in the sensor output signal.

10 Claims, 1 Drawing Sheet

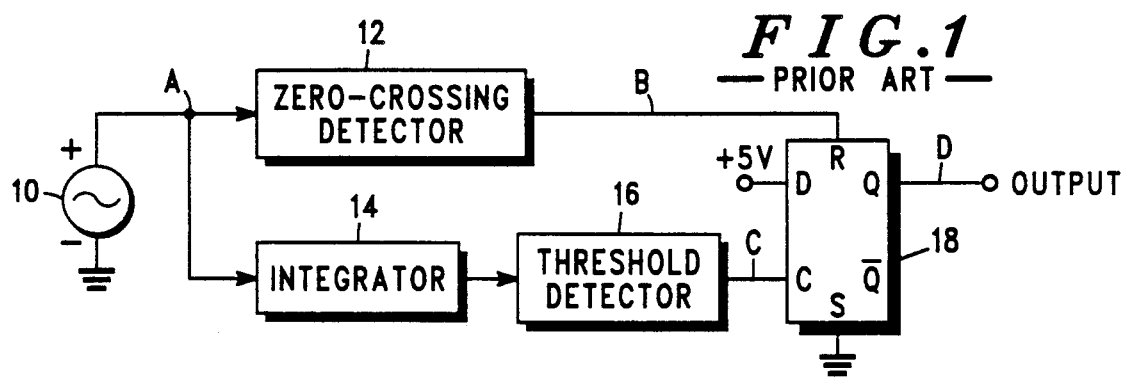
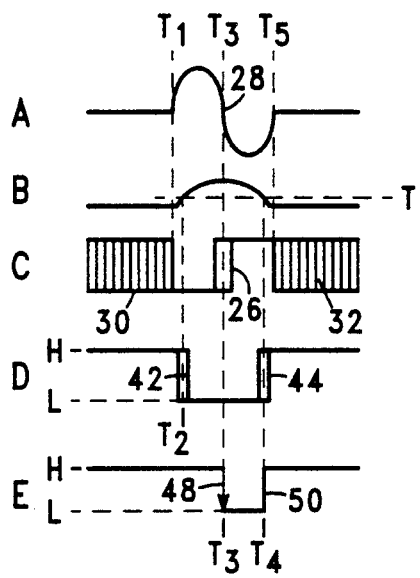
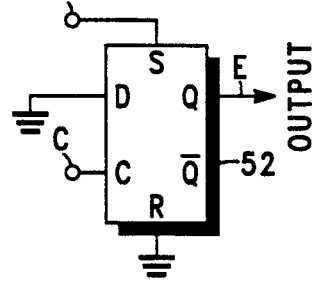
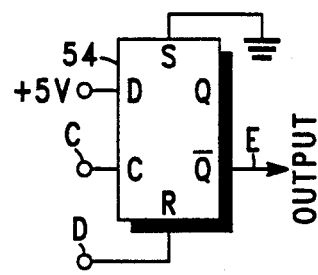
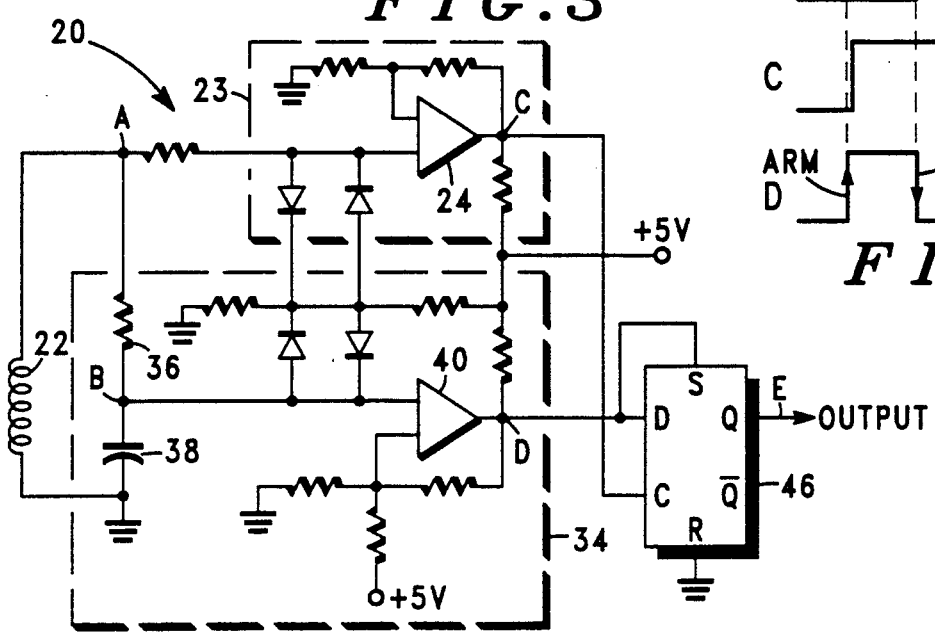
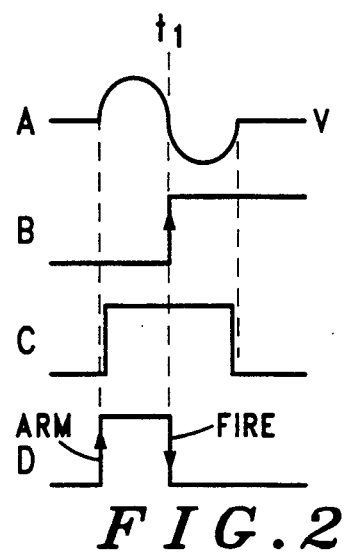

THRESHOLD CROSSING DETECTOR

FIELD OF THE INVENTION

This invention is generally directed to circuitry for detecting a threshold crossing in the output signal of a sensor, and for generating a further, typically binary, signal that is free of noise and that accurately identifies the threshold crossing.

BACKGROUND OF THE INVENTION

In a prior art threshold detector (sometimes referred to as a "zero-crossing" detector), the output of a sensor is processed by circuitry such as that shown in FIG. 1.

In the illustrated arrangement, a sensor 10 (such as a reluctance sensor) develops an output signal A which, as shown by waveform A in FIG. 2, is a sinusoidal type signal superimposed on a threshold level V. At time $t_1$, the signal A crosses the threshold V, thereby generating a "threshold-crossing". In the case where the threshold level V is zero volts, the transition at $t_1$ is referred to as a "zero-crossing". The purpose of the circuity shown in FIG. 1 is to develop a binary output signal that has a single transition (as opposed to multiple, unwanted transitions) at $t_1$, and that is substantially free of any noise that may be superimposed on the signal A.

Referring again to FIG. 1, the signal A is coupled to the input of a zero-crossing (or threshold-crossing) detector 12 that generates a binary level output signal B (see waveform B in FIG. 2) having a positive-going transition that occurs at time $t_1$.

The sensor signal A is also applied to an integrator 14 which applies an integrated version of the signal A to a threshold detector 16. The output of the detector 16 is a binary signal C (see waveform C in FIG. 2). This signal C is applied to the clock (C) input of a flip-flop 18, while the signal B is applied to the reset (R) input of the same flip-flop.

The purpose of the flip-flop is to generate a noise-free output signal D (see waveform D in FIG. 2) that has an "arm" transition and a "fire" transition. The "arm" transition is included for the purpose of establishing an amplitude level from which one can generate the "fire" transition. The "fire" transition is the important one, as it represents the time when the sensor signal experiences its threshold-crossing. In a typical automotive application, the "fire" transition gets counted, or otherwise used, to form a timing reference for a fuel injector or the like.

A problem with the foregoing approach is that, in some applications, extra circuitry may be needed to ensure that the integrated sensor signal (i.e., the signal formed by the integrator 14 and the threshold detector 16) has a fast enough rise time and/or fall time to reliably clock the arming of the output signal. In FIG. 1, for example, the signal applied to the "clock" input of the flip-flop 18 must have a relatively rapid transition in order to reliably clock the flip-flop and thereby generate the "arm" transition shown in waveform D. While in many applications the flip-flop can be reliably clocked if the integrated sensor signal is properly processed (such as by including pulse shaping circuitry within, or in addition to, the threshold detector 16), it is preferable to derive the output signal differently in order to minimize the risk of providing an improper "arm" and "fire" type output signal, while at the same time ensuring that the output signal remains free of multiple, unwanted transitions.

OBJECTS OF THE INVENTION

It is a general object of the invention to provide an improved method and apparatus for developing an accurate and reliable output signal representative of a sensor signal's threshold crossing.

It is another object of the invention to provide such an output signal that does not have multiple, unwanted transitions.

BRIEF DESCRIPTION OF THE FIGURES

FIG. 1, previously discussed, shows a prior art threshold detector;

FIG. 2 shows various waveforms produced by the detector of FIG. 1;

FIG. 3 is a schematic diagram of a threshold detector in accordance with the invention;

FIG. 4 shows waveforms produced by the detector of FIG. 3;

FIG. 5 shows an alternate output logic circuit for use with the detector of FIG. 3; and FIG. 6 shows another output logic circuit that may be used with the detector of FIG. 3.

DESCRIPTION OF THE PREFERRED EMBODIMENT

Referring to FIG. 3, a threshold detector 20 is shown which incorporates the features of the invention. This threshold detector includes a sensor 22 that generates, at node A, a sensor signal such as that shown by waveform A of FIG. 4. This waveform depicts one cycle of a sensor signal that begins at time $T_1$, undergoes a threshold crossing 28 at $T_3$, and ends at $T_5$.

A first, conventional signal processing circuit 23, including a comparator 24, receives the sensor signal from node A. The signal processing circuit 23 develops, at node C, a first signal (see waveform C of FIG. 4) that has a relatively fast transition 26 that represents the threshold crossing 28 of the sensor signal. Preferably, only a single transition 26 will occur, but, as shown, a double transition (indicated by the two vertical lines near time $T_3$) may result because of noise in the sensor signal (waveform A) which can appear as one or more threshold crossings near the time $T_3$. Such multiple threshold crossings can give rise to corresponding multiple transitions in the signal at node C.

Waveform C is also shown with multiple transitions 30 prior to time $T_1$, and additional multiple transitions 32 after $T_5$. The multiple transitions 30 illustrate how noise on the sensor signal at node A can result in one or more transitions occurring in the signal at node C prior to time $T_1$. Likewise, the multiple transitions 32 illustrate how noise on the sensor signal can result in one or more transitions occurring in the signal at node C after time $T_5$. The important point to understand is that there may be multiple, noise-induced transitions in the signal at node C rather than a single transition at each of the times $T_1$, $T_3$, and $T_5$, and these multiple transitions can occur randomly. In spite of these multiple transitions, it is important that the threshold detector 20 generate an output signal that has only 1 transition that represents the threshold crossing of the sensor signal.

Referring again to FIG. 3, a second signal processing circuit 34, including an RC integrator (resistor 36 and capacitor 38) and a comparator 40, receives the sensor signal from node A. This second signal processing circuit develops, at node D, a second signal (see waveform D) that has transitions 42, 44 between a first level (H) and a second level (L), and that is representative of an integrated version of the sensor signal. To develop this output signal, the signal processing circuit 34 first integrates the sensor signal by means of the RC integrator to develop, at node B, an integrated signal as shown by waveform B in FIG. 4. The signal processing circuit 34 then, using the comparator 40 and its associated circuitry, compares the integrated signal at node B to a threshold level T, and develops the output signal at node D. As can be seen from waveform D, this output signal undergoes the transition 42 when the integrated signal (waveform B) exceeds the threshold level T, and it undergoes the transition 44 when the integrated signal falls below the threshold level T. It can also be seen that multiple transitions 42, 44 may occur as the result of noise on the integrated signal. However, the illustrated embodiment of the invention precludes such multiple transitions in waveform D from generating multiple transitions in the ultimate output signal (waveform E) developed by the threshold detector 20.

Referring again to FIG. 3, an output logic circuit, shown as a "D-type" flip-flop 46, (e.g., type MC 14013B made by Motorola, Inc.) receives the signals from nodes C and D to develop an output signal (see waveform E) on an output lead E. According to one aspect of the invention, the first and second signals (from nodes C and D) are processed so as to: hold the output signal (E) at a given level (e.g., level H) while the second signal is at its first level (e.g., at level H); when the second signal reaches its second level (e.g., level L), the output signal E is enabled to undergo a transition from its given level (H) to a second level (L); and then the relatively fast transition 26 in the first signal (waveform C) is used to clock the output signal E to the second level (L). As discussed in more detail below, this technique uses the transition 26 which is relatively fast (as opposed to using a speeded-up version the integrated sensor signal) to develop an output signal E that has but a single transition (at time $T_3$) representing the threshold crossing of the sensor signal, irrespective of the possible multiple transitions shown in waveforms C and D.

Turning again to FIG. 3, the flip-flop 46 has a clock input (C) receiving the first signal from node C, and a data input (D) receiving the second signal from node D. In this embodiment, the set input (S) of the flip-flop also receives the signal from node D, and the reset input (R) is grounded. The Q output of the flip-flop provides the output signal E.

The flip-flop 46 operates as follows. The output signal E is held at the level H until the occurrence of the positive-going transition 26 in the clock signal (waveform C), at which time ($T_3$) the Q output assumes the state of the D input. Because the D input is low at $T_3$, the signal E undergoes a negative-going transition 48. This transition 48 represents the threshold crossing 28 in the sensor signal. Note also that the clocking transition 26 occurs while the D input is stable; i.e. multiple transitions in the signal at the flip-flop's D input do not occur at or near time $T_3$. Therefore, even if multiple transitions 26 occur in waveform C, the output signal E will have only one transition 48. The single transition 48 may move somewhat, either to the left or right of its illustrated position, in response to noise-induced changes in the position of a transition 26, but only a single transition 48 will be developed.

After the transition 48 occurs, the output signal E is maintained at the level L so long as waveform D remains at its level L, irrespective of further transitions in waveform C. The set input to the flip-flop drives the output signal E high again (transition 50) in response to a positive-going transition 44 in waveform D. Having been thus driven high, the signal E is not influenced by possible multiple transitions 32 or 44 in waveforms C and D.

The present technique for developing the output signal E is not limited to the use of D-type flip-flops as shown in FIG. 3. Other types of logic circuits may be used, or other configurations of D-type flip-flops may also be used. One such alternate configuration is shown in FIG. 5. In this embodiment, a flip-flop 52 has a Q output that provides the output signal E, a set input receiving waveform D, and a clock input receiving waveform C, all as shown in the embodiment of FIG. 3. In the embodiment of FIG. 5, however, the data (D) input is grounded. This means that the transition 48 is developed in the manner described for the FIG. 3 embodiment, but the transition 50 is generated by the set input going high when the D signal has returned to its level H. As with the embodiment of FIG. 3, the output signal E is free of multiple transitions.

Another embodiment is shown in FIG. 6. Here, a flip-flop 54 has a reset (R) input receiving waveform D, a clock (C) input receiving waveform C, a data input (D) coupled to +5 volts, and a $\overline{Q}$ output terminal at which the waveform E is developed. With this arrangement, a transition 48 is generated in the output signal E in response to a positive-going transition 26 in waveform C, and a transition 50 is generated in response to the reset input being driven high by a transition 44 in waveform D. This arrangement also eliminates multiple transitions from the output signal E.

A feature of the embodiments discussed above is that they all use the threshold-crossing signal developed by the first signal processor 23 to clock the output signal. Since the output from the first signal processor 23 tends to always have a relatively fast transition which can be reliably used for clocking purposes, there is less need for including pulse-shaping circuitry in the second signal processor 34 to ensure that its output includes a fast transition that can be used for clocking. Further, all the embodiments provide an output signal that is free of multiple, unwanted transitions, even in the presence of noise on the sensor signal.

Although the invention has been described in terms of preferred structures, it will be obvious to those skilled in the art that various alterations and modifications can be made without departing from the invention. Accordingly, it is intended that all such modifications and alterations be considered as within the spirit and scope of the invention as defined by the appended claims.

What is claimed is:

1. In a system which processes a sensor signal that has a threshold-crossing to form: (a) a first signal having a relatively fast transition that represents the threshold-crossing of the sensor signal, and (b) a second binary signal that has transitions between first and second levels and that is representative of an integrated version of the sensor signal, a method of processing the first and second signals to form a binary level output signal, the method comprising:

(1) holding the output signal at a given level A while the second signal is at its first level;

(2) when the second signal reaches its second level, enabling the output signal to undergo a transition from the given level A to a second level B, and then (3) using the transition in the first signal to clock the output signal to the second level B.

2. A method as set forth in claim 1 further including:

(4) maintaining the output signal at the second level B so long as the second signal remains at its second level, irrespective of further transitions in the first signal.

3. A threshold-crossing detector having:

a sensor for producing a sensor signal having a threshold-crossing;

a first signal processing circuit receiving the sensor signal for developing a first signal that has a relatively fast transition that represents the sensor signal's threshold-crossing;

a second signal processing circuit receiving the sensor signal for developing a second signal that has transitions between first and second levels and that is representative of an integrated version of the sensor signal; and an output circuit receiving the first and second signals for developing an output signal having an amplitude transition that represents the threshold-crossing of the sensor signal;

characterized in that the output circuit comprises a logic circuit having a clock input receiving the first signal, and a second input receiving the second signal, the logic circuit being responsive to the transition in the first signal for driving the output signal rapidly from a first logic level to a second logic level, thereby generating an amplitude transition representing the threshold-crossing of the sensor signal.

4. A threshold-crossing detector as set forth in claim 3 wherein the logic circuit comprises a flip-flop having a clock input which receives the first signal and a data input receiving the second signal.

5. A threshold-crossing detector as set forth in claim 4 wherein the flip-flop also has a set input that receives the second signal.

6. A threshold-crossing detector as set forth in claim 4 wherein the flip-flop also has a reset input that is coupled to a reference potential.

7. A threshold-crossing detector as set forth in claim 3 wherein the logic circuit comprises a flip-flop having a clock input which receives the first signal and a reset input that receives the second signal.

8. A threshold detector as set forth in claim 7 wherein the flip-flop also includes a data input that is coupled to a positive voltage source.

9. A threshold-crossing detector for use with a sensor whose output signal undergoes a threshold-crossing, the detector comprising:

a first signal processing circuit receiving the sensor signal for developing a first signal that has a relatively fast transition that represents the sensor signal's threshold-crossing;

a second signal processing circuit receiving the sensor signal for developing a second signal that has transitions between first and second levels and that is representative of an integrated version of the sensor signal; and a flip-flop having an output, a clock input, and a set input, the clock input receiving the first signal and the set input receiving the second signal.

10. A threshold-crossing detector as set forth in claim 9 wherein the flip-flop also includes a data input that receives the second signal.

* * * * *